United States Patent
Sinha et al.

(10) Patent No.: US 10,284,205 B2
(45) Date of Patent: May 7, 2019

(54) ADAPTIVE BANDWIDTH SYSTEMS AND METHODS

(71) Applicant: Infineon Technologies AG, Neubiberg (DE)

(72) Inventors: Samaksh Sinha, Singapore (SG); Sai Siddharth Pothapragada, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/331,098

(22) Filed: Oct. 21, 2016

(65) Prior Publication Data

US 2018/0115315 A1    Apr. 26, 2018

(51) Int. Cl.
| | |
|---|---|
| *H03L 1/00* | (2006.01) |
| *H02M 3/07* | (2006.01) |
| *H03L 7/093* | (2006.01) |
| *H03L 7/099* | (2006.01) |
| *H03L 7/097* | (2006.01) |
| *H03L 7/107* | (2006.01) |

(52) U.S. Cl.
CPC ............. *H03L 1/00* (2013.01); *H02M 3/07* (2013.01); *H03L 7/093* (2013.01); *H03L 7/097* (2013.01); *H03L 7/099* (2013.01); *H03L 7/107* (2013.01); *H03L 7/1072* (2013.01); *H03L 7/1075* (2013.01); *H03L 2207/06* (2013.01)

(58) Field of Classification Search
CPC ..... H03L 1/00; H03L 7/06; H03L 7/08; H03L 7/085; H03L 7/093; H03L 7/099; H02M 3/02; H02M 3/04; H02M 3/0607; H02M 3/073

USPC .................................................. 327/156–158
See application file for complete search history.

(56) References Cited

U.S. PATENT DOCUMENTS

| | | |
|---|---|---|
| 3,328,719 A | 6/1967 | Lisle et al. |
| 5,631,587 A | 5/1997 | Co et al. |
| 5,748,044 A | 5/1998 | Xue |
| 5,933,037 A | 8/1999 | Momtaz |
| 7,349,515 B1 | 3/2008 | Chew et al. |
| 7,646,226 B2 | 1/2010 | Kim |

(Continued)

FOREIGN PATENT DOCUMENTS

CN    101159433 B    8/2011

OTHER PUBLICATIONS

Office Action dated Aug. 16, 2018 for German Application No. 102017124566.9.

*Primary Examiner* — Lincoln D Donovan
*Assistant Examiner* — Diana J. Cheng
(74) *Attorney, Agent, or Firm* — Schiff Hardin LLP

(57) ABSTRACT

A clock generator and a method to control an associated system are described. The clock generator (e.g., a PLL) can include a charge pump that can generate a current, and a controller coupled to the charge pump. The controller can determine a characteristic impacting operation of the clock generator and control the charge pump to adjust the current based on the determined characteristic to adjust a bandwidth of the clock generator. The clock generator and method can include adjusting the bandwidth to compensate for variations (e.g. PVT variations) that impact the operation of the clock generator to maintain constant or substantially constant bandwidth independent of such variations.

19 Claims, 5 Drawing Sheets

(56) References Cited

U.S. PATENT DOCUMENTS

| | | | |
|---|---|---|---|
| 7,696,831 B2* | 4/2010 | Song | H03L 7/0893 |
| | | | 327/156 |
| 7,907,022 B2 | 3/2011 | Thakur et al. | |
| 8,378,725 B2 | 2/2013 | Thakur et al. | |
| 8,390,356 B2 | 3/2013 | Shinde | |
| 8,638,143 B2* | 1/2014 | Nilsson | H03L 7/0891 |
| | | | 327/148 |
| 2006/0273835 A1 | 12/2006 | Rodgers et al. | |
| 2012/0319786 A1 | 12/2012 | Kumar et al. | |
| 2015/0130514 A1 | 5/2015 | Lee et al. | |

* cited by examiner

ADAPTIVE BANDWIDTH SYSTEMS AND METHODS

BACKGROUND

Field

Embodiments described herein generally relate to adaptive systems and methods, including systems and method to maintain a constant bandwidth under system variations (e.g., PVT variations).

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

Figure 1:
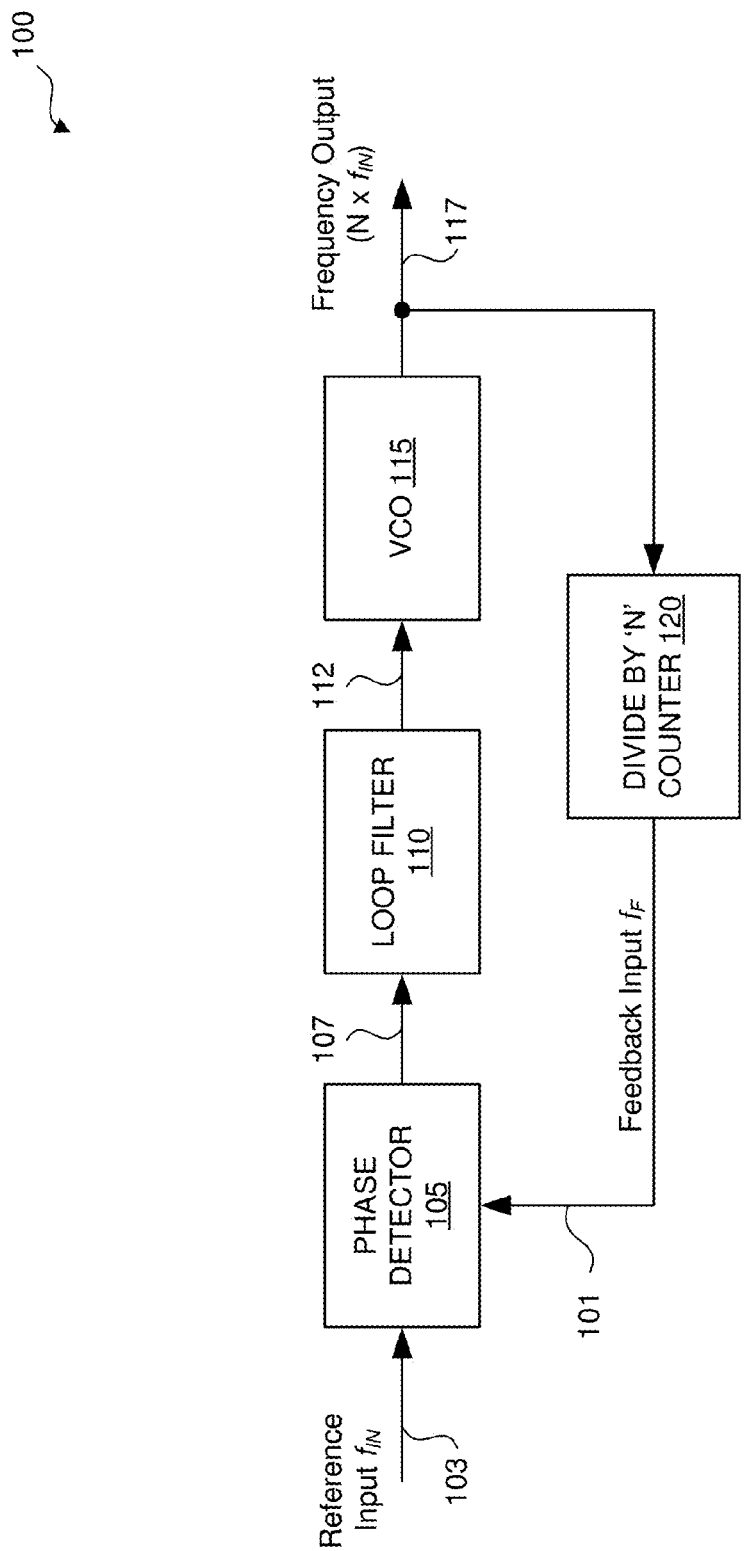
FIG. 1 illustrates an example Phase Locked Loop (PLL) according to the present disclosure.

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

As an overview, a Phase Locked Loop (PLL) device configured to generates an output signal whose phase is related to the phase of an input signal. For example, the PLL can generate an output clock signal having a second frequency (e.g., 2.4 GHZ) based on an input clock signal having a first frequency (e.g., 40 MHz). The first frequency can be lower than the second frequency, but is not limited thereto. In an exemplary operation, the PLL can be configured to generate a high frequency clock signal for on-chip components of a chip based on a local oscillator having a lower frequency.

In operation, the output signal of the PLL reaches ("locks onto") the desired output frequency based on the input signal. The locking of the frequency is performed over one or more clock cycles. In operation, the number of clock cycles to lock onto to the output frequency is inversely proportional to the bandwidth of the PLL. The lock time (and the amount of jitter following the frequency lock) is related to the bandwidth of the PLL. For example, a change in bandwidth will result in a change in the lock time of the PLL and the amount of jitter following the frequency lock. In exemplary embodiments, the bandwidth of the PLL is adjusted to maintain a constant or substantially constant bandwidth, thereby maintaining a constant or substantially constant lock time and jitter of the PLL. In this example, the bandwidth is inversely proportional to the lock time of the PLL.

Process, Voltage and Temperature (PVT) variations can cause variations of the bandwidth. In one or more exemplary embodiments, one or more parameters of the bandwidth are adjusted based on one or more PVT variations to control the PLL to have a constant or substantially constant bandwidth. In an exemplary embodiment, the current of the PLL is adjusted to adjust the bandwidth so as to maintain the constant/substantially constant bandwidth.

The present disclosure is not limited to PLL control systems and the aspects described herein related to PLL configurations can be applied to other systems and devices, such as other time-dependent systems. For example, the regulation of voltage by a voltage regulator includes a lock time of the regulated voltage based on the input voltage. In this example, one or more parameters effecting the regulation of the voltage can be adjusted to maintain a constant/substantially constant lock time to regulation of the voltage. The aspects can be applied to other systems as would be understood by one of ordinary skill in the relevant arts.

FIG. 1 illustrates an example PLL 100 according to the present disclosure. The PLL 100 includes a phase detector 105, a loop filter 110, a voltage controlled oscillator (VCO) and a division counter 120.

The phase detector 105 is configured to receive a reference input signal ($f_{IN}$) 103 and a feedback frequency ($f_F$) 101, and to generate a phase detection signal 107 based on the reference input signal $f_{IN}$ and the feedback frequency $f_F$. The reference input signal $f_{IN}$ can be, for example, a clock signal generated by an oscillator. The phase detector 105 can include processor circuitry configured to perform the operations and/or functions of the phase detector 105, including generating the phase detection signal 107. The phase detector 105 can include, for example, one or more logic gates configured to implement an exclusive OR (XOR) operation, but are not limited thereto.

The loop filter 110 is configured to receive the phase detection signal 107 and generate a filtered signal 112 based on the phase detection signal 107. The loop filter 110 can include one or more passive and/or active circuit components, such as one or more resistors, capacitors, and/or inductors.

The VCO 115 is configured to generate an output signal 117 having an oscillation frequency. The oscillation frequency can be controlled based on the voltage of the filtered signal 112 generated by the loop filter 110. In operation, the applied input voltage (of the filtered signal 112) determines the instantaneous oscillation frequency of the output signal 117. The VCO 115 can include one or more passive and/or active circuit components, such as one or more resistors, capacitors, inductors, transistors, and/or amplifiers (e.g., operational amplifiers). In an exemplary embodiment, the output signal 117 satisfies the following equation:

$$f_{output} = N \times f_{IN}$$

where $f_{output}$ is the output signal 117, $f_{IN}$ is the reference input signal 103, and N is a frequency factor (e.g., 60).

The division counter 120 is configured to divide an input signal by a frequency factor N to generate an output signal. For example, the division counter 120 can divide the output signal 117 by the frequency factor N to generate the feedback frequency ($f_F$) 101. In an exemplary embodiment, the division counter 120 is configured to generate the feedback frequency ($f_F$) 101 that satisfies the following equation:

$$f_F = \frac{f_{output}}{N}$$

In operation, when the PLL 100 has locked onto the desired output frequency, the feedback frequency ($f_F$) will be equal to (or substantially equal to) the reference input signal 103 ($f_{IN}$).

Figure 2:
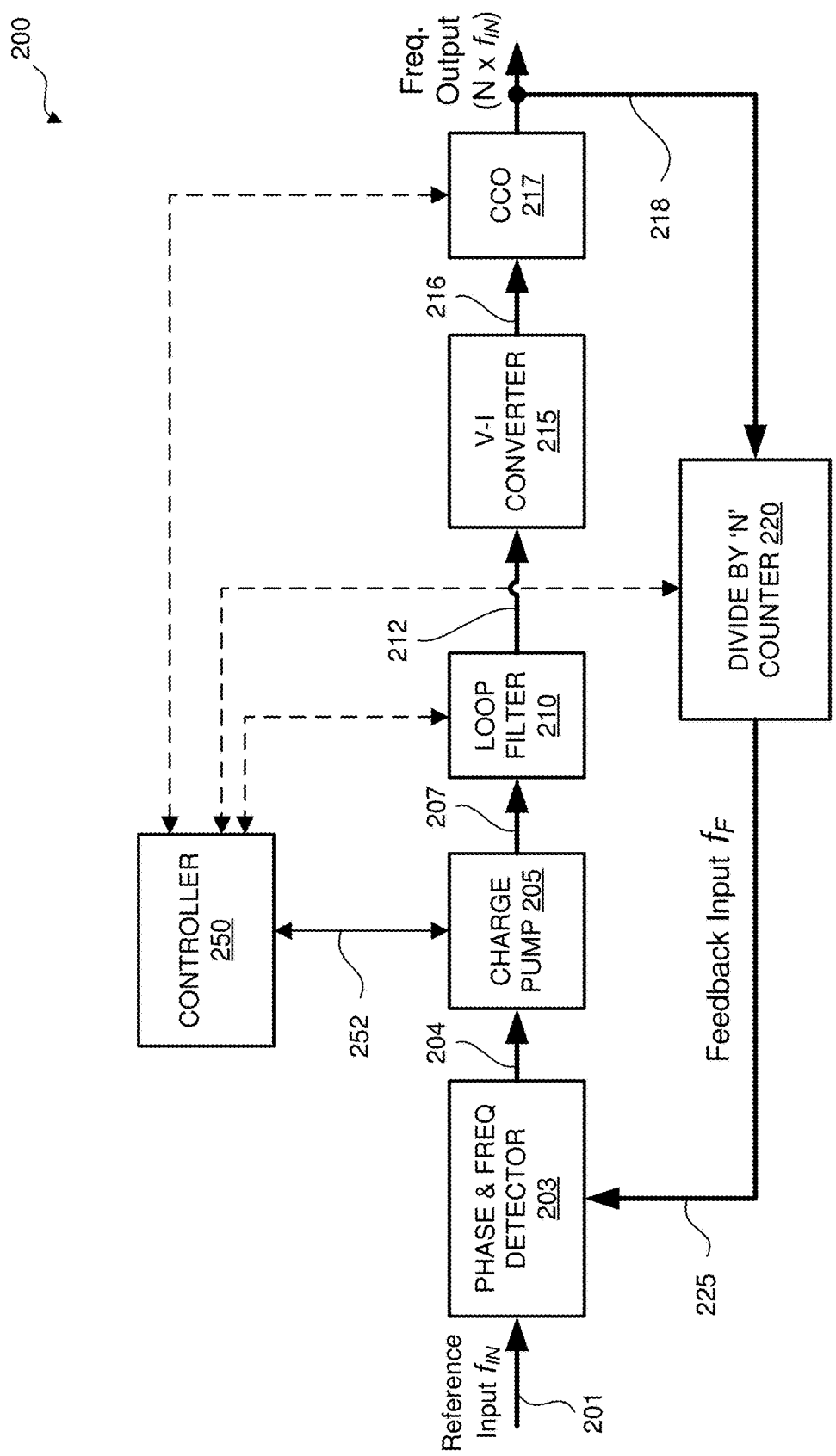
FIG. 2 illustrates a PLL according to exemplary embodiments of the present disclosure.

FIG. 2 illustrates a PLL 200 according to an exemplary embodiment of the present disclosure. The PLL 200 includes a phase and frequency detector 203, a charge pump 205, a loop filter 210, voltage-to-current (V-I) converter 215, a current controlled oscillator (CCO), a division counter 220, and a controller 250.

The phase and frequency detector 203 is configured to receive a reference input signal ($f_{IN}$) 201 and a feedback frequency signal ($f_F$) 225, and to generate a detection signal 204 based on the reference input signal $f_{IN}$ and the feedback frequency $f_F$. The detection signal 204 can represent the detected phase and/or frequency of the feedback frequency signal ($f_F$) 225 based on a comparison to the reference input signal ($f_{IN}$) 201.

The reference input signal $f_{IN}$ can be, for example, a clock signal generated by an oscillator. The phase and frequency detector 203 can include processor circuitry configured to perform the operations and/or functions of the phase and frequency detector 203, including generating the detection signal 204. The phase and frequency detector 203 can include, for example, one or more logic gates configured to implement an exclusive OR (XOR) operation, but are not limited thereto.

The charge pump 205 is configured to generate an output current 207 based on the detection signal 204 and a control signal received from the controller 250 via control path 252. In an exemplary embodiment, the charge pump 205 can include one or more current sources and/or one or more current sinks (which can collectively be referred to as a current bank or a current mirror) configured to generate a current. The current charge pump 205 is not limited to current banks/mirrors configured to generate a variable current, and can additionally or alternatively include other analog and/or digital circuitry configured to generate a variable current as would be understood by one of ordinary skill in the art. The circuitry can include, for example, amplifiers (e.g., operational amplifiers), transistors, resistors, capacitors, inductors, and/or other analog and/or digital circuit components as would be understood by one of ordinary skill in the art. In an exemplary embodiment, the charge pump 205 is a variable current source configured to generate the output current 207. The variable current source can include one or more passive and/or active circuit components, such as one or more resistors, capacitors, inductors, transistors, and/or amplifiers (e.g., operational amplifiers), configured to generate the output current 207. In an exemplary embodiment, the charge pump is configured to generate a variable current based on the control signal from the controller 250 to adjust the frequency of the output signal 218 ($f_{output}$).

In an exemplary embodiment, the charge pump 205 can include one or more current banks (also referred to as current mirrors), each configured to generate a current. In embodiments having two or more current banks/mirror, the currents generated by the current banks/mirrors can be the same or different. In an exemplary embodiment, the current bank(s)/mirror(s) can include one or more current sources and/or one or more current sinks. For example, a current bank/mirror can include a current source connected to a current bank via an output bus. The current bank/mirror can include one or more switches configured to selectively connect the current source and/or selectively connect the current sink to the output bus. For example, a current source can be selectively connected to the output bus via a first switch and the output bus can be selectively connected to the corresponding current sink via a second switch. In this example, current source, the output bus, and the current sink are connected in series. The input of the current source is connected to a supply voltage and the output is connected to the output bus via the first switch. The input of the current source sink is connected to the output bus via the second switch and the output of the current sink is connected to a common voltage, such as ground.

Figure 3:
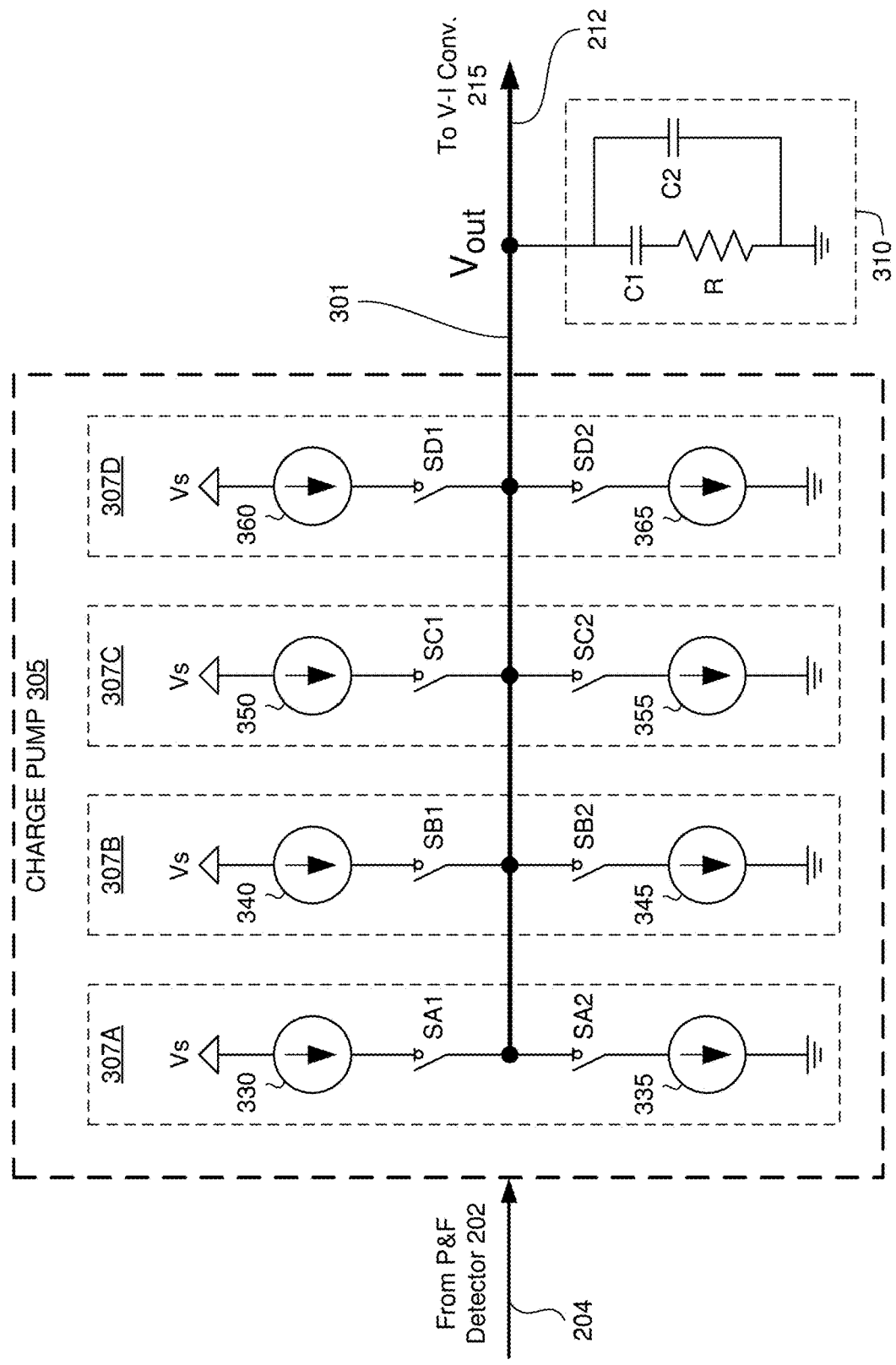
FIG. 3 illustrates a charge pump and loop filter according to exemplary embodiments of the present disclosure.

In embodiments including multiple current banks/mirrors, one or more of the corresponding switches of one or more current banks can be selectively opened or closed to adjust the current on the output bus. An exemplary embodiment of the charge pump 205 is illustrated in FIG. 3, but is not limited thereto.

The filter loop 210 is configured to receive the output current 207 and generate a filtered signal 212 based on the output current 207. The filtered signal 212 can be an output voltage $V_{out}$, where $V_{out}$ corresponds to the voltage drop across the filter loop 210 to a common voltage such as ground. The loop filter 110 can include one or more passive and/or active circuit components, such as one or more resistors, capacitors, and/or inductors, configured to generate the filtered signal 212. In an exemplary embodiment, the filter loop 210 includes a capacitor in series with a resistor, and a capacitor in parallel with the series capacitor and resistor. In this example, the filter loop 210 can be connected from the output bus of the charge pump 205 to a common voltage, such as ground. More specifically, the capacitor and resistors in series can be connected from the output bus of the charge pump 205 to ground and the parallel capacitor is also connected from the output bus to ground. In another embodiment, the filter loop 210 includes a capacitor in series with a resistor. The loop filter 210 can include other components and/or arrangements as would be understood by one of ordinary skill in the relevant arts. The filtered output 212 of the loop filter 210 can be provided to the V-I converter 215.

The V-I converter 215 can be configured to convert an input voltage to an output current 216 corresponding to the input voltage (e.g., filtered output 212). The V-I converter 215 can include one or more passive and/or active circuit components, such as one or more resistors, capacitors, inductors, transistors, and/or amplifiers (e.g., operational amplifiers), configured to convert an input voltage to an output current. In operation, the V-I converter 215 can generate the output current 216 based on the filtered output 212 (e.g., $V_{out}$) of the loop filter 210, and provide the output current 216 to the CCO 217.

The CCO 217 is configured to generate an output signal 218 having an oscillation frequency based on an input signal (e.g., output current 216). The oscillation frequency can be controlled based on the current of the output current signal 216 of the V-I converter 215. In operation, the applied input current (of the output current signal 216) determines the instantaneous oscillation frequency of the output signal 218. The CCO 217 can include one or more passive and/or active circuit components, such as one or more resistors, capacitors, inductors, transistors, and/or amplifiers (e.g., operational amplifiers), configured to generate the output signal 218 having an oscillation frequency that is dependent on the input signal (e.g., output current signal 216).

In an exemplary embodiment, the output signal 218 satisfies the following equation:

$$f_{output} = N \times f_{IN}$$

where $f_{output}$ is the output signal 218, $f_{IN}$ is the reference input signal 201, and N is a frequency factor (e.g., 60).

In an alternate embodiment, the V-I converter 215 can the CCO 217 can be replaced with a VCO configured to generate the output signal 218 having an oscillation frequency that is based on the filtered output 212 (e.g., $V_{out}$) of the loop filter 210.

The division counter 220 is configured to divide an input signal by a frequency factor N to generate an output signal. For example, the division counter 220 can divide the output signal 218 by the frequency factor N to generate the feedback frequency signal ($f_F$) 225. In an exemplary embodiment, the division counter 220 is configured to generate the feedback frequency signal ($f_F$) 225 that satisfies the following equation:

$$f_F = \frac{f_{output}}{N}$$

In operation, when the PLL 200 has locked onto the desired output frequency, the feedback frequency signal ($f_F$) 225 will be equal to (or substantially equal to) the reference input signal 201 ($f_{IN}$). In an exemplary embodiment, PLL 200 is configured to generate a 2.4 GHz signal from a 40 MHz signal, but is not limited hereto. In this example, the reference input signal 201 ($f_{IN}$) has a frequency of 40 MHz, the output signal (218) $f_{output}$ has a frequency of 2.4 GHz when locked, and the frequency factor N is 60.

The division counter 220 can include one or more passive and/or active circuit components, such as one or more resistors, capacitors, inductors, transistors, flip-flops, and/or amplifiers (e.g., operational amplifiers), configured to divide the output signal 218 by the frequency factor N to generate the feedback frequency signal ($f_F$) 225. The division counter 220 can also be referred to as a frequency divider, a clock divider, and/or a scaler.

The controller 250 can be configured to control the output current 207 generated by the charge pump 205. The controller can be configured to generate a control signal and provide the control signal to the charge pump 205 via the connection 252. In an exemplary embodiment, the control signal is generated based on Process, Voltage and Temperature (PVT) variations experienced by the PLL 200. The PVT variations can cause variations of the bandwidth of the PLL 200, and the controller 205 can be configured to adjust one or more parameters of the bandwidth to maintain a constant or substantially constant bandwidth, thereby maintaining a constant or substantially constant lock time and jitter of the PLL 200. The parameters of the bandwidth can include, for example, the current of the charge pump 205, the capacitance of the loop filter 210, the frequency factor N of the division counter 220, the gain of the CCO 217 (or VCO), and/or one or more other parameters as would be understood by one of ordinary skill in the relevant arts. In this example, the controller 250 can be configured to communicate with one or more components of the PLL 200 via one or more corresponding connections illustrated by the dashed connections.

In an exemplary embodiment, the controller 250 is configured to control the current of the charge pump 207 to adjust the bandwidth so as to maintain the constant/substantially constant bandwidth of the PLL 200. For example, the controller 250 can control the operation of one or more current banks of the charge pump 205 to adjust the current (207) of the charge pump 205.

In an exemplary embodiment, the controller 250 can include a reference generator that is configured to generate a reference value that is independent of PVT variations and a PVT generator that is configured to generate a variation value that is dependent on PVT variations. The controller 250 can be configured to compare the reference value and the variation value to determine the degree of PVT variations effecting the PLL 200. The controller 250 can then generate the control signal based on the comparison and to control the current 207 of the charge pump 205 (and/or other parameters of the PLL 200) to adjust the bandwidth of the PLL 200 so as to maintain constant/substantially constant bandwidth of the PLL 200.

In an exemplary embodiment, the bandwidth of the PLL 200 satisfies the following equation:

$$\sqrt{\frac{I}{2\pi} \frac{C_p}{N} K_{co}}$$

Where, I is the charge pump current, $C_p$ is capacitance of the loop filter 210, N is the frequency factor of the division counter 220, $K_{co}$ is the gain of the CCO 217 (or VCO in some embodiments), and π is pi.

In an exemplary embodiment, the controller 250 is configured to adjust one or more of the parameters I, $C_p$, and/or $K_{co}$ to adjust the bandwidth of the PLL 200. In an exemplary embodiment, the controller 205 adjusts the current I of the charge pump 205 to adjust the bandwidth of the PLL 200.

Table 1 below illustrates example lock times based on example PVT variations.

TABLE 1

| Process (N-P) | Voltage (V) | Temp. (° C.) | Lock Time (μs) |
|---|---|---|---|
| Fast-Fast | 1.325 | −40 | 4 |
| Fast-Slow | 1.325 | −40 | 30 |
| Typical-Typical | 1.25 | 27 | 8 |
| Slow-Fast | 1.175 | 125 | 6 |
| Slow-Slow | 1.175 | 125 | 39 |

Table 2 below illustrates example lock times for PLL 200 that is configured to adjust the current of the charge pump 205 to adjust the bandwidth of the PLL 200.

TABLE 2

| Process (N-P) | Voltage (V) | Temp. (° C.) | CP Current (µA) | Lock Time (µs) |
|---|---|---|---|---|
| Fast-Fast | 1.325 | −40 | 10 | 8.4 |
| Fast-Slow | 1.325 | −40 | 60 | 8.0 |
| Typical-Typical | 1.25 | 27 | 60 | 8.7 |
| Slow-Fast | 1.175 | 125 | 80 | 7.7 |
| Slow-Slow | 1.175 | 125 | 100 | 7.5 |

As illustrated in Table 2, the variations of the lock times of the PLL 200 is reduced and within 10% of the bandwidth of a typical-typical (e.g., baseline) configuration.

FIG. 3 illustrates a charge pump 305 and a loop filter 310 according to exemplary embodiments of the present disclosure. The charge pump 305 and loop filter 310 are embodiments of the charge pump 205 and loop filter 210 of FIG. 2, respectively.

As illustrated in FIG. 3, the charge pump 305 includes one or more current banks/mirrors 307. The current bank(s)/mirror(s) 307 can include a current source 330/340/350/360 and a current sink 335/345/355/365 connected to output bus 301. For brevity, the discussion of the current banks 307 will be made with respect to current bank/mirror 307A, but is applicable to current banks 307B-D. Although four current banks 307 are illustrated, the number of current banks/mirrors 307 is not limited.

The current source 330 of current bank 330 is driven by a voltage source Vs and is selectively connected to the output bus 301 via switch SA1. The current sink 335 is selectively connected to the output bus 301 via switch SA2 and also to ground. In an exemplary embodiment, the currents generated by the current banks 307A-D can be the same or different. For example, the current generated by the current bank 307A can be 10 the current generated by current banks 307B and 307C can be 20 µA, and the current generated by current bank 307D can be 50 µA. In this example, by the selective activation (via the switches) of the current banks 307A-D, the charge pump 305 can generate a current in the range of 0 to 100 µA. The current values and number of current banks 307 is not limited to these example values. One of ordinary skill in the art will understand that the current values and number of current banks 307 can be modified to achieve a charge pump having a different current output range and tunability (i.e., the current increments between selectable output currents). In an exemplary embodiment, the controller 250 is configured to control the activation of the switches SA1-SD2 to adjust the current of the charge pump 305.

The output of the output bus 310 is illustrated by the voltage $V_{out}$ at the loop filter 310. In an exemplary embodiment, the loop filter 310 includes a first capacitor C1 in series with a resistor R, and the capacitor C1 and R are connected in parallel with a second capacitor C2. The capacitor C1 and resistor R are connected in series between the output bus 301 and ground. The capacitor C2 is also connected in series between the output bus 301 and ground.

Figure 4:
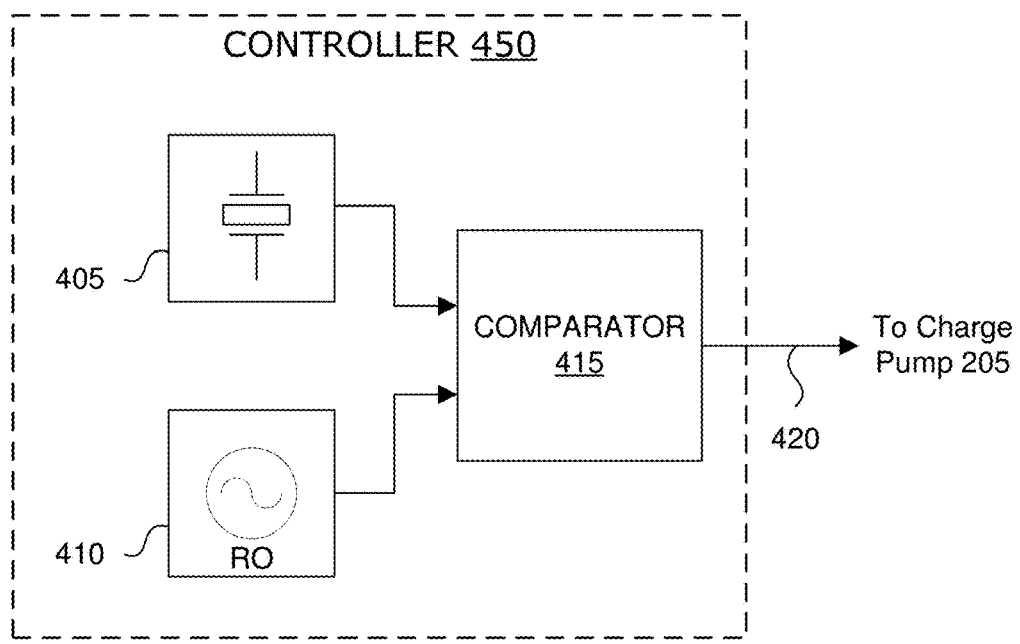
FIG. 4 illustrates a controller according to an exemplary embodiment of the present disclosure.

FIG. 4 illustrates a controller 450 according to an exemplary embodiment of the present disclosure. The controller 450 can be an embodiment of the controller 250. The controller 450 can include a reference generator 405 a PVT generator 410, and a comparator 415. The reference generator 405 can be configured to generate a reference value that is independent of PVT variations while the PVT generator can be configured to generate a variation value that is dependent on PVT. The reference value and the variation value can be provided to the comparator 415 by the reference generator 405 and the PVT generator, respectively.

In an exemplary embodiment, the reference generator 405 is a crystal oscillator configured to generate an output signal having an oscillation frequency that is independent (or substantially independent) of PVT variations. The PVT generator 410 can be a ring oscillator configured to generate an output signal having an oscillation frequency that is dependent (or substantially dependent) on PVT variations. In operation, the reference value generated by the reference generator 405 will remain constant or substantially constant under PVT variations while the variation value generated by the PVT generator 410 will vary based on the PVT variations.

The comparator 415 can be configured to receive the reference value and the variation value and to compare the two values to each other. The comparator 415 can configured to generate a control signal 420 based on the comparison. The comparator 415 can include one or more passive and/or active circuit components, such as one or more resistors, capacitors, inductors, transistors, and/or amplifiers (e.g., operational amplifiers), configured to generate the control signal 420 based on the comparison of the reference value and the variation value. For example, the comparator 415 can include an operational amplifier whose inverted and non-inverted inputs are connected to the generator 405 and 410, respectively. In an exemplary embodiment, additionally or alternatively, the comparator 415 includes processor circuitry configured to compare the reference value and the variation value, and to generate the control signal 420 based on the comparison.

Figure 5:
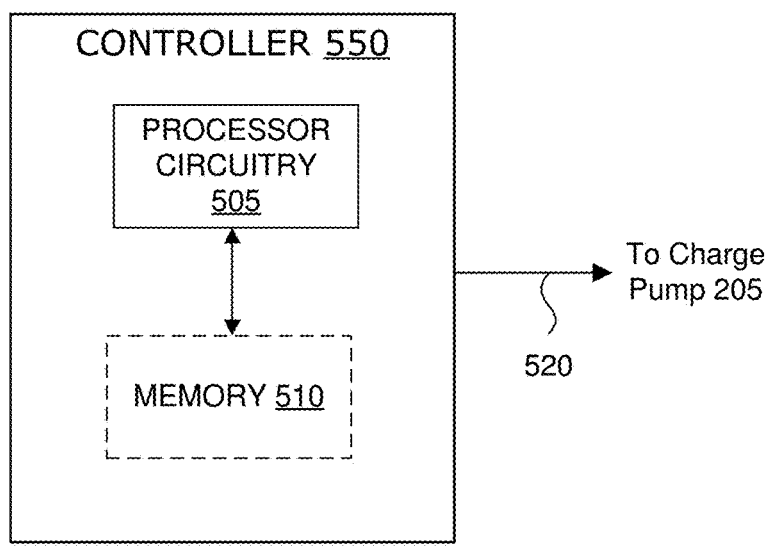
FIG. 5 illustrates a controller according to an exemplary embodiment of the present disclosure.

FIG. 5 illustrates a controller 550 according to an exemplary embodiment of the present disclosure. The controller 550 can be an embodiment of the controller 250. The controller 550 can include processor circuitry 505. In some embodiments, the controller 550 also includes memory 510. In an exemplary embodiment, the processor circuitry 505 is configured to generate or otherwise obtain (e.g., read a predetermined threshold from memory 510) a reference value that is independent of PVT variations and generate a variation value that is dependent on PVT variations.

In an exemplary embodiment, the processor circuitry 505 includes a sensor that is configured to sense PVT variations (e.g., temperature sensor, voltage sensor, etc.). Based on the sensed PVT variations, the processor circuitry 505 can generate a variation value. In an embodiment, the variation value can be determined from a look-up table (LUT) or other database stored in memory 510 based on the sensed value from the sensor. The processor circuitry 505 can be configured to compare the reference value and the variation value to generate the control signal 520 based on the comparison.

The memory 510 can be any well-known volatile and/or non-volatile memory that stores data and/or instructions, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

Figure 6:
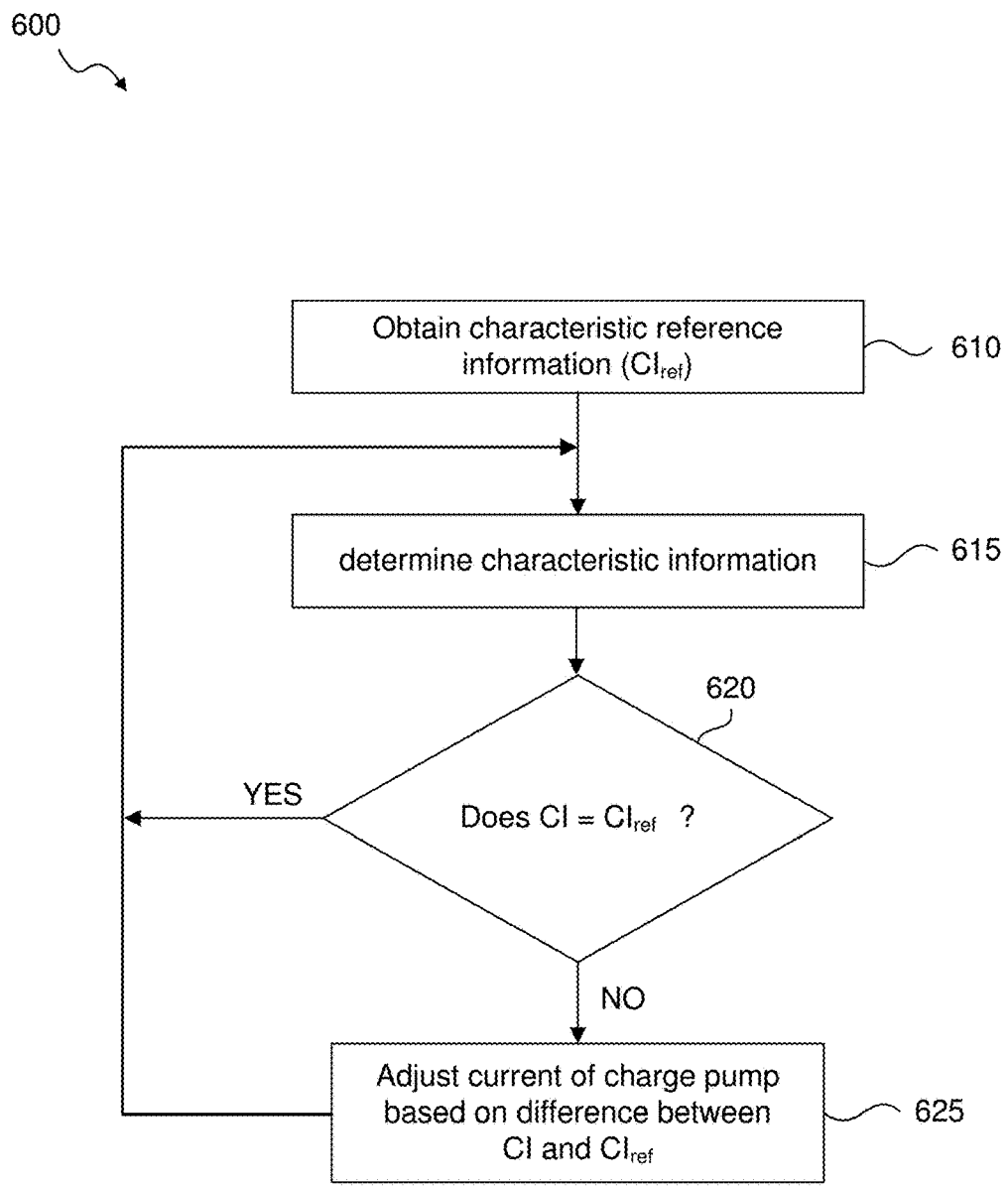
FIG. 6 illustrates a flowchart of an adjustment method according to an exemplary embodiment of the present disclosure.

FIG. 6 illustrates a flowchart 600 of bandwidth adjustment method according to an exemplary embodiment of the present disclosure. The flowchart is described with continued reference to FIGS. 1-5. The steps of the method are not limited to the order described below, and the various steps may be performed in a different order. Further, two or more steps of the method may be performed simultaneously with each other.

The method of flowchart 600 begins at step 610, where characteristic reference information is obtained. For example, the reference value can be obtained by the reference generator 405. That is, the characteristic reference information is a value that is independent of PVT variations.

After steps 610, the flowchart 600 transitions to step 615, where characteristic information is determined. For example, the variation value is determined based on PVT variations of the system.

After steps 615, the flowchart 600 transitions to step 620, where the characteristic reference information is compared to the characteristic information to determine if PVT variations are effecting the system (e.g., the bandwidth of the PLL).

If the characteristic reference information is equal to the characteristic information (YES at step 620), the flowchart 600 returns to step 615. That is, if PVT variations are not effecting the system, the flowchart 600 returns to step 615.

If the characteristic reference information does not equal the characteristic information (NO at step 620), the flowchart 600 transitions to step 625. That is, if the PVT variations are effecting the system, the variation value will change and will not be equal to the reference value.

At step 625, one or more parameters/characteristics of the system are adjusted based on the difference between the variation value and the reference value. For example, the value of the current of the PLL can be adjusted to maintain a constant bandwidth of the PLL. As would be understood by one of ordinary skill in the relevant arts, the compensation for PVT variations (or other variations) can be applied to other systems. For example, the locking time of a regulation of voltage by a voltage regulator can be maintained based on the adjustment of one or more parameters of the voltage regulator.

After step 625, the flowchart 600 returns to step 615 or ends.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A clock generator, comprising:
a detector that is configured to generate a detection signal based on a reference frequency signal and a feedback frequency signal;
a charge pump coupled to the detector and configured to generate a current based on the detection signal and a control signal; and
a controller coupled to the charge pump and configured to:
determine a degree at which a process, voltage and/or temperature variation impacts operation of the clock generator based on a reference value and a variation value that are independent of the reference frequency signal and/or the feedback frequency signal; and generate the control signal based on the determined degree and provide the control signal to the charge pump to control the charge pump to adjust the current.

2. The clock generator of claim 1, wherein the controller is configured to adjust a bandwidth of the clock generator based on the current adjustment to compensate for an impact of the variation on the bandwidth of the clock generator.

3. The clock generator of claim 1, wherein the controller is configured to adjust a bandwidth of the clock generator based on the current adjustment to compensate for an impact of the variation on a locking time of the clock generator.

4. The clock generator of claim 1, wherein the charge pump comprises:
a plurality of current mirrors configured to be selectively activated based on the control signal generated by the controller, the selective activation of the plurality of current mirrors adjusts the current generated by the charge pump.

5. The clock generator of claim 1, wherein the charge pump comprises a variable current source that is configured to generate a variable current to varying the current generated by the charge pump, the generation of the variable current being based on the control signal generated by the controller.

6. The clock generator of claim 1, wherein the controller is further configured to:
determine the reference value that is independent of the variation and the variation value that is dependent on the variation;
compare the reference value with the variation value to determine the degree of impact of the variation; and
generate the control signal based on the comparison.

7. The clock generator of claim 1, further comprising a loop filter coupled to the charge pump and configured to filter the current to generate a filtered signal.

8. The clock generator of claim 7, wherein the loop filter comprises:
a first capacitor in connected in series with a resistor, the first capacitor and the resistor being connected between an output of the charge pump and ground; and
a second capacitor connected in parallel with the first capacitor and the resister connected in series.

9. The clock generator of claim 7, further comprising an oscillator that is configured to generate an output signal based on the filtered signal, the feedback frequency signal being based on the output signal, wherein the controller is configured to adjust the current generated by the charge pump to adjust a bandwidth of the output signal.

10. The clock generator of claim 1, wherein the clock generator is a phase locked loop (PLL).

11. A phase locked loop (PLL), comprising:
a detector that is configured to generate a detection signal based on a reference frequency signal and a feedback frequency signal;
a charge pump that is configured to generate a current signal based on the detection signal and a control signal;
a loop filter configured to generate a filtered signal based on the current signal;
an oscillator configured to generate an output signal based on the filtered signal, the feedback frequency signal being based on the output signal; and
a controller coupled to the charge pump and configured to:
determine a degree at which a process, voltage and/or temperature variation impacts operation of the oscillator based on a reference value and a variation value that are independent of the reference frequency signal and/or the feedback frequency signal; and
generate the control signal based on the determined degree and provide the control signal to the charge pump to control the charge pump to adjust the current signal to adjust a bandwidth of the PLL.

12. The PLL of claim 11, wherein the controller is configured to adjust the bandwidth of the PLL based on the adjustment of the current signal to compensate for an impact of the variation on the bandwidth of the PLL.

13. The PLL of claim 11, wherein the charge pump comprises:
a plurality of current mirrors configured to be selectively activated based on the control signal generated by the controller, the selective activation of the plurality of current mirrors adjusts the current signal generated by the charge pump.

14. The PLL of claim 11, wherein the charge pump comprises a variable current source that is configured to generate a variable current to varying the current signal generated by the charge pump, the generation of the variable current being based on the control signal generated by the controller.

15. The PLL of claim 11, wherein the loop filter comprises:
a first capacitor in connected in series with a resistor, the first capacitor and the resistor being connected between an output of the charge pump and ground; and
a second capacitor connected in parallel with the first capacitor and the resister connected in series.

16. The clock generator of claim 1, wherein the controller is configured to control the charge pump to adjust the current based on the determined degree to maintain a bandwidth of the clock generator.

17. The clock generator of claim 16, wherein the current is adjusted based on the determined degree to compensate for an impact of the variation on the bandwidth of the clock generator.

18. The clock generator of claim 1, wherein the controller comprises:
a reference generator that is configured to generate the reference value that is independent of the variation; and
a variation generator that is configured to generate the variation value that is dependent on the variation.

19. The clock generator of claim 18, wherein:
the reference generator is a crystal oscillator that is configured to generate the reference value having an oscillation frequency that is independent of the variation; and
the variation generator is a ring oscillator that is configured to generator the variation value having an oscillation frequency that is dependent on the variation.

* * * * *